United States Patent
Kossel et al.

(10) Patent No.: US 8,044,732 B2
(45) Date of Patent: Oct. 25, 2011

(54) CONTINUOUSLY TUNABLE INDUCTOR AND METHOD TO CONTINUOUSLY TUNE AN INDUCTOR

(75) Inventors: Marcel A. Kossel, Reichenburg (CH); Thomas E. Morf, Gross (CH); Martin Leo Schmatz, Rueschlikon (CH); Jonas R. Weiss, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/369,021

(22) Filed: Feb. 11, 2009

(65) Prior Publication Data

US 2009/0201097 A1  Aug. 13, 2009

(30) Foreign Application Priority Data

Feb. 12, 2008  (EP) ..................................... 08101515

(51) Int. Cl.
  *H03B 5/12*  (2006.01)
(52) U.S. Cl. .................................. 331/117 FE; 331/181
(58) Field of Classification Search .................. 331/181, 331/36 L, 117 R, 117 FE, 167, 177 R, 179
  See application file for complete search history.

(56) References Cited

U.S. PATENT DOCUMENTS

| 7,098,737 B2 * | 8/2006 | Fujimoto et al. ............... 330/283 |
| 7,301,407 B2 * | 11/2007 | Cho ............................. 331/36 C |
| 2007/0132522 A1 * | 6/2007 | Lee et al. ....................... 331/167 |

FOREIGN PATENT DOCUMENTS

JP  2004096510 A  *  3/2004

OTHER PUBLICATIONS

Rategh, et al., "A CMOS Frequency Synthesizer with an Injection-Locked Frequency Divider for a 5-GHz Wireless LAN Receiver", May 2000, IEEE Journal on Solid-State Circuits, vol. 35, No. 5, pp. 780-787.*

* cited by examiner

*Primary Examiner* — Ryan Johnson
(74) *Attorney, Agent, or Firm* — Gail H. Zarick; Vazken Alexanian; Lily Neff

(57) ABSTRACT

A continuously tunable inductor with an inductive-capacitive (LC) voltage controlled oscillator (VCO) having a primary coil. The inductor includes a separate isolated secondary coil, a set of transistors composing a closed loop with the secondary coil, a magnetic coupling between the primary coil of the LC VCO and the secondary coil, an electrical coupling between the LC VCO and the set of transistors composing a closed loop with the secondary coil, and means for electric current injection into the closed loop. Such an inductor can be tuned by modulating a mutual inductance, which is magnetically and electrically coupled with the LC VCO by injection of an electric current ($I_0$).

11 Claims, 3 Drawing Sheets

CONTINUOUSLY TUNABLE INDUCTOR AND METHOD TO CONTINUOUSLY TUNE AN INDUCTOR

CROSS REFERENCE TO RELATED APPLICATION

This application claims priority under 35 U.S.C. 119 from European Patent Application 08101515.8 filed Feb. 12, 2008, the entire contents of which are incorporated herein by reference.

BACKGROUND OF THE INVENTION

1. Field of the Invention

The invention relates to design of a continuously tunable inductor applied to an inductance-capacitance (LC) tank voltage controlled oscillator (VCO).

2. Description of Related Art

High performance clock generators are often based on LC VCOs because the high quality factor or Q-factor of the LC tank allows achieving good phase noise performance and low jitter generation. The quality factor is a measure of how efficient the ratio of stored energy to power losses is exploited in an oscillating system. For electrical oscillators it can be expressed as $$Q = \frac{\Im(Z)}{\Re(Z)}$$

where Z denotes the impedance of the resonating structure, e.g. the LC-tank or one of its components.

The LC-tank of state-of-the-art LC VCOs typically consists of an inductor with a fixed inductance value that is connected in parallel to a set of varactor banks for frequency band selection or coarse tuning and an additional fine tuning varactor. If only a relatively small frequency band of typically less than 15% has to be covered and the mid-band frequency is not extremely high, like, for example, <15 GHz, such a state-of-the-art LC-tank design with a fixed value inductor might be sufficient. The situation changes if either a wide tuning range, for example, one octave, or a very high frequency range has to be covered and additionally, for cost saving reasons, only a cheap process technology like a digital CMOS process is available that does not offer varactors with a high Q-factor.

A wide frequency tuning range would be desired for many varactor banks that degrade the Cmax/Cmin-ratio of the fine tuning varactor due to their fixed value capacitive parasitics. The high number of varactor banks might also degrade the overall quality factor of the LC-tank because of the additional resistive losses that occur with the long wiring connections from the different varactor banks to the inductor of the LC-tank.

If a very high frequency range needs to be covered, the quality factor of the varactor becomes smaller than the Q-factor of the inductor. This is caused by the fact that the reactive part of the varactor impedance is inverse proportional to the frequency (Zvar~1/jωC) while the inductor impedance increases with increasing frequency (Zind~jωL).

In either of the above mentioned cases it might be beneficial if a continuously tunable inductor would be available in order to save some of the varactor banks or even to replace the continuously tunable fine tuning varactor by a continuously tunable inductor.

SUMMARY OF THE INVENTION

Shortcomings of the prior art are overcome and additional advantages are provided by a continuously tunable inductor comprising an LC VCO with a primary coil. According to the present invention, the continuously tunable inductor further includes a separated isolated secondary coil, a set of transistors composing a closed loop with the separated isolated secondary coil, a magnetic coupling between the primary coil of the LC VCO and the separated isolated secondary coil, an electrical coupling between the LC VCO and the set of transistors composing the closed loop with the separated isolated secondary coil, and means for electric current injection into the closed loop.

Another aspect of the invention includes a method to continuously tune an inductor such as is described above. According to the method, tuning of the inductor is achieved by modulating a mutual inductance, which is magnetically and electrically coupled with the LC VCO of the injector. The modulating is performed by injection of an electric current.

The continuously tunable inductor according to the invention has the advantage over the prior art, that it allows continuously varying the magnitude of mutual inductance.

The foregoing, together with other objects, features, and advantages of this invention can be better appreciated with reference to the following specification, claims and drawings.

BRIEF DESCRIPTION OF THE DRAWINGS

The present invention and the preferred modes of making and using it will be readily understood when referring to the detailed description of illustrative embodiments in connection with the drawings, in which.

DETAILED DESCRIPTION OF THE PREFERRED EMBODIMENTS

Figure 1:
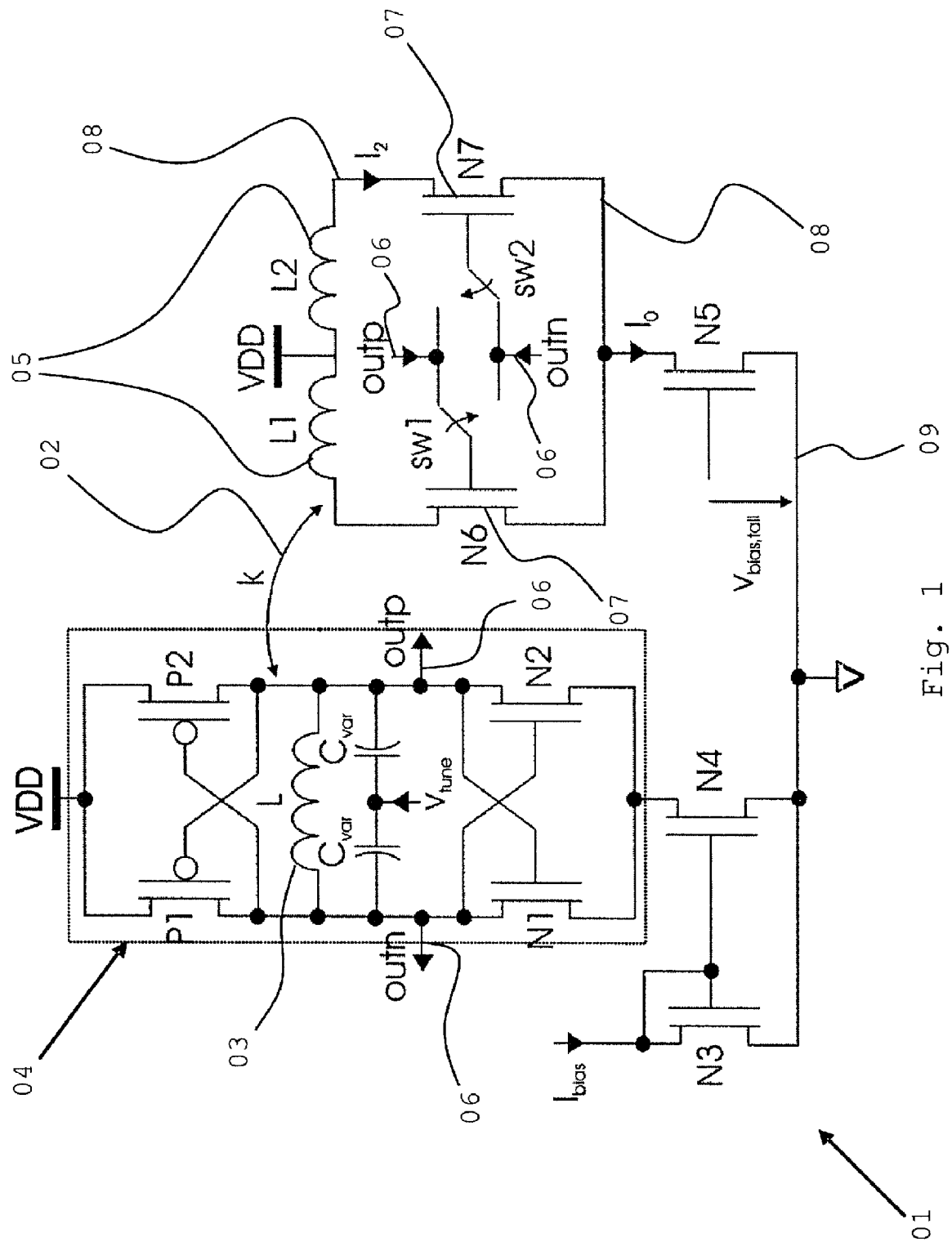
FIG. 1: is a circuit diagram of a LC VCO with a continuously tunable inductance of a LC-tank.

The continuously tunable inductor according to the invention has the advantage over the prior art, that it allows continuously varying the magnitude of mutual inductance, which reduces the self-inductance of the VCO inductor, by either varying the amount of injected current or/and the transconductance of the electrically coupled transistors.

This is achieved by the secondary coil that is magnetically coupled to the primary coil of the LC VCO and a set of transistors that are electrically coupled to the LC VCO. The set of electrically coupled transistors, together with the magnetically coupled coil, form a closed loop. In addition to the induced current flowing through the magnetically coupled coil, a variable current from an extra current source can be injected into the closed loop. The electrically coupled transistors modulate both currents and induce a mutual inductance in the inductor of the LC VCO itself.

The magnitude of mutual inductance, which reduces the self-inductance of the VCO inductor, can be continuously varied by either varying the amount of injected current or/and the transconductance of the electrically coupled transistors.

The sign of mutual inductance can be changed by swapping or inverting the direction of electrical coupling of the set of transistors in the closed loop.

According to a preferred embodiment of the invention, the primary coil is an inductor of a LC-tank.

Preferably, the LC VCO is composed of a cross-coupled n-type metal-oxide semiconductor (NMOS) transistor pair and a cross-coupled p-channel metal-oxide semiconductor (PMOS) transistor pair plus a LC-tank consisting of an inductor and at least one set of two preferably fine tuning varactors.

According to a preferred embodiment of the invention, the LC VCO is fed by a NMOS current mirror, particularly by a NMOS current mirror implemented as a tail current source transistor and a diode-connected transistor. The same function of a LC VCO can also be obtained when a PMOS tail current source is used. In general, a variety of LC VCO topologies can be used to achieve the benefits and advantages of the invention. These topologies are not limited to NMOS Field Effect Transistors (FET). In general an LC VCO comprises a PMOS or a NMOS voltage source and one or two cross-coupled pair of transistors, which can be PMOS as well as NMOS. Further a LC-tank comprising an arrangement of an inductivity in parallel to a capacity or a varactor bank is arranged in parallel to the cross-coupled transistors.

According to a preferred embodiment of the invention, the magnetic coupling between the primary coil of the LC VCO and the separated isolated secondary coil is defined by a coupling factor k according to:

$$k = \frac{M}{\sqrt{L \cdot (L_1 + L_2)}},$$

where M denotes the mutual inductance between the set of coupled isolated coils and the inductance of the LC-tank inductor.

According to another preferred embodiment of the invention, the gate of a first NMOS transistor is selectively connected through a first switch to a first or a second output node of the LC VCO, and the gate of a second NMOS transistor is selectively connected through a second switch to the second or the first output node of the LC VCO. The switch positions of the first and second switch are complementary with each other and define the sign of the mutual inductance. If for instance the first NMOS transistor is connected via the first switch to the first output node and the second NMOS transistor is connected via the second switch to the second output node, the mutual inductance M is positive. On the other hand, if the first switch connects the first NMOS transistor to the second output node and switch the second switch connects the second NMOS transistor to the first output node, the mutual inductance M becomes negative because the electrical coupling counteracts the magnetic coupling.

Preferably the common node of the two NMOS transistors is connected to the means for electric current injection into the closed loop.

In a preferred embodiment of the invention, the means for electric current injection into the closed loop includes a tail current source transistor, which provides a DC path and performs an injection of electric current into the closed loop consisting of the differential transistor pair and the secondary coils. The current of the tail current source superimposes to the induced current flowing in the coupled coils. Both currents get modulated by the transistors within the closed loop according to the electrical coupling to the outputs of the LC VCO. The modulated current also flows through the coupled coils, which are magnetically coupled to the inductor of the LC VCO and therefore contribute to the mutual inductance between the primary coil, which is the inductor of the LC VCO, and secondary coils, which are the coupled coils. Because of the injected current through the tail current source, the amount of mutual inductance can be controlled by the amount of current flowing through the tail current source.

Another aspect of the invention includes a method of continuously tuning an inductor such as is described above. According to the method, tuning of the inductor is achieved by modulating a mutual inductance, which is magnetically and electrically coupled with the LC VCO of the injector. The modulating is performed by injection of an electric current.

Preferably, the electrically and magnetically coupled mutual inductance is generated by magnetically coupling a separated isolated secondary coil to the primary coil of the LC VCO, composing a closed loop with the separated isolated secondary coil and a set of transistors, and electrically coupling the LC VCO and the set of transistors of said closed loop.

The modulation of the magnetically and electrically coupled mutual inductance by injection of an electric current preferably is performed by injecting an electric current into the closed loop.

Referring to FIG. 1, an exemplary embodiment of a continuously tunable inductor applied to a LC-tank VCO is shown.

The continuously tunable inductor 01 shown in FIG. 1 basically consists of three parts:
1) a magnetic coupling 02 between the coil 03 of the LC VCO 04 and a separated isolated coil 05;
2) an electrical coupling 06 between the LC VCO 04 and a set of transistors 07 forming a closed loop 08 with the separated isolated coil 05; and
3) a means 09 for electric current injection into the closed loop 08 consisting of the isolated coil 05 and the set of transistors 07. Means 09 allows injecting the current $I_0$ into the closed loop 08.

An LC VCO 04 composed of a cross-coupled NMOS transistor pair N1, N2 and a cross-coupled PMOS transistor pair P1, P2 is an exemplary implementation shown in FIG. 1. The LC-tank consists of an inductor L, which is the coil 03, and two fine tuning varactors Cvar. A set of varactor banks for the coarse tuning is not shown in FIG. 1 to keep the illustration simple.

The LC oscillator 04 is fed by a NMOS current mirror implemented as a tail current source transistor N4 and a diode-connected transistor N3. This LC VCO 04 represents an example of a LC-tank based differential oscillator 04. Other types of LC-tank oscillators can be employed as well without limiting the scope of the invention.

The inductor L, i.e. the coil 03 of the LC-tank is magnetically coupled to a set of isolated coils L1 and L2, which are the coil 05, by a coupling factor k defined as:

$$k = \frac{M}{\sqrt{L \cdot (L_1 + L_2)}}$$

where M denotes the mutual inductance between the set of isolated coils L1, L2 and the inductance L of the LC-tank inductor. L1 and L2 are identical and their common node is connected to the dc supply voltage VDD. In a practical implementation L1 and L2 are represented by a single inductor coil 05 with a center-tap connected to VDD. When using the terminology of a transformer, the inductor L can be considered as the primary coil 03 and the combination of L1, L2 can be considered as the secondary coil 05.

Next, two NMOS transistors N6, N7 are connected in parallel to L1 and L2. Via these transistors an electrical coupling is established to the LC VCO. The gate of N6 is connected through switch sw1 to the output node outp. Analogously, the other output node outn of the differential LC VCO is connected through switch sw2 to the gate of N7. The switch positions are complementary with each other and define the sign of the mutual inductance.

If, for instance, N6 is connected via sw1 to outp and N7 is connected via sw2 to outn, the mutual inductance M is positive. On the other hand, if switch sw1 connects N6 to outn and switch sw2 connects N7 to outp, the mutual inductance M becomes negative because the electrical coupling counteracts the magnetic coupling.

The common node of N6 and N7 is connected to the tail current source transistor N5, which provides a DC path and performs an injection of electric current into the closed loop consisting of the differential transistor pair N6, N7 and the secondary coils L1, L2. The current $I_0$ of the tail current source is superimposed on the induced current $I_2$ flowing in the coupled coils L1 and L2. Both currents $I_0$, $I_2$ are modulated by the transistors N6, N7 according to the electrical coupling to the outputs of the LC VCO 04.

The modulated current also flows through L1, L2, which are magnetically coupled to L and therefore contribute to the mutual inductance between the primary 03 and secondary coils 05 as defined above in the transformer terminology. Because of the injected current through the tail current source, the amount of mutual inductance can be controlled by the amount of current flowing through the tail current source N5. This can be understood by the formula of the induced voltage $u_i$ in the primary coil:

$$u_i = -\frac{d\phi}{dt} = -\frac{d}{dt}\left(\int\int \vec{B}\cdot d\vec{S}\right),$$

where B is the magnetic field generated by the secondary coil 05 and flowing through the area S. Temporal changes of the magnetic flux $\phi$ generate the induced voltage $u_i$. The magnetic field B can be expressed as:

$$\vec{B} = \mu\vec{H} \approx \frac{\mu(I_1 + I_2)\cdot \sin(\omega\cdot t + \varphi)}{2\pi\omega}\vec{e}_r$$

with $\phi$ representing a potential phase shift between the electrical and magnetic coupling, e.g. through the delays of the modulating transistors N6, N7.

If the tail current source N5 has finite output impedance, which means that it is a non-ideal current source, a variation of the transconductance gm of the differential transistor pair N6 and N7 might have a similar impact as changing the current of the tail current source. The transconductance can be changed for instance by a parallel connection of differential transistor pairs or by a back-gate modulation of N6 and N7.

Figure 2:
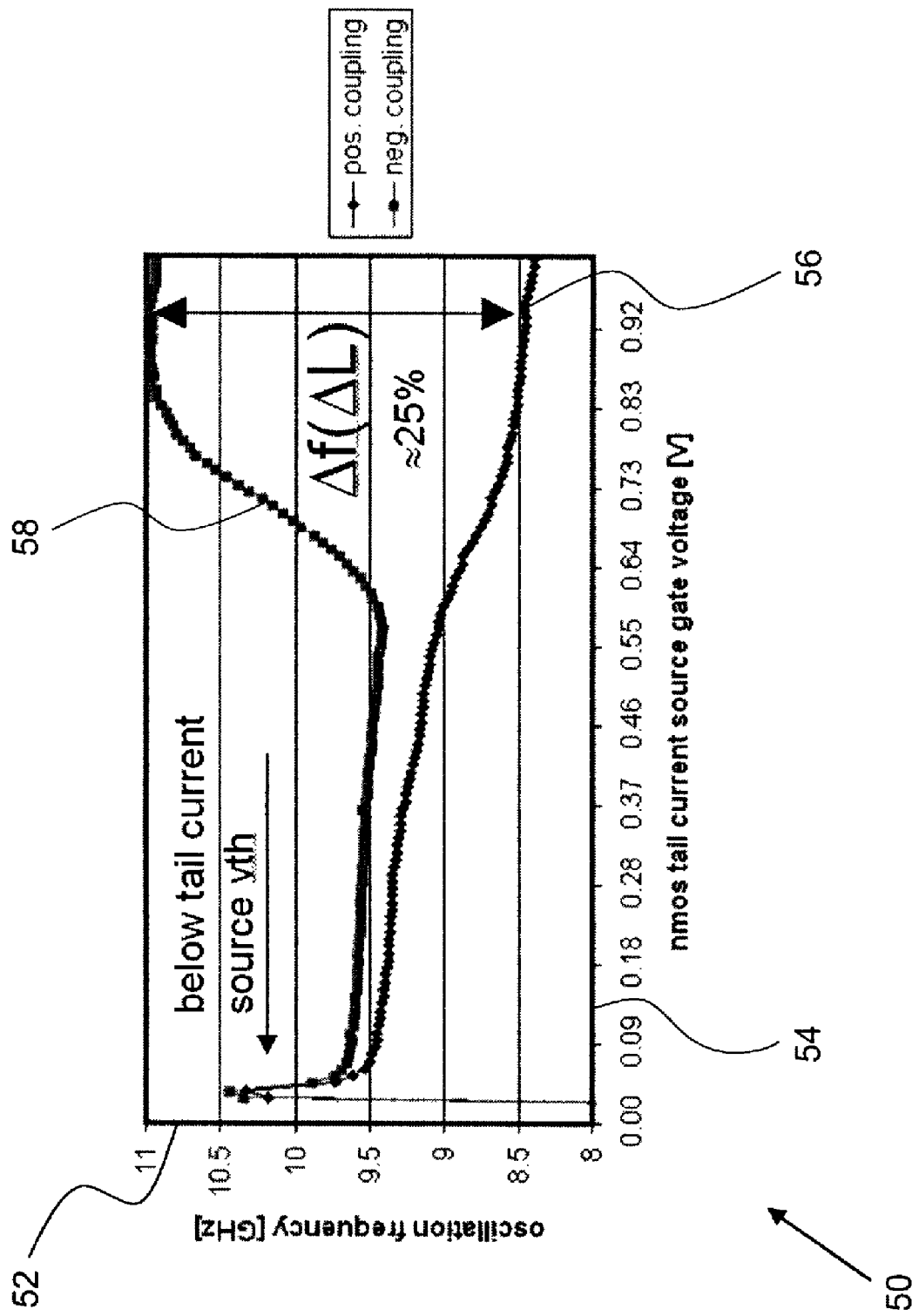
FIG. 2: is a diagram depicting the frequency tuning range of the LC VCO in FIG. 1 with continuously tunable inductance of the LC-tank.

Referring to FIG. 2, an example is shown of a transistor level simulation of the LC-VCO 04 with continuously tunable inductor L that is shown in FIG. 1. The diagram 50 in FIG. 2 displays the oscillation frequency on the vertical axis 52 and the gate bias voltage of the tail current source, which is N5 in FIG. 1, on the horizontal axis 54. There are two curves 56, 58 that are distinguished by the settings of the switches sw1 and sw2 to select either the positive 56 or negative 58 sign of the mutual inductance.

When increasing the gate bias voltage of the tail current source the oscillation frequency does not change very much up to about 0.5V. This is because the transistors N5, N6 and N7 are operated below their threshold voltages in that biasing region. Above the threshold voltages however the two curves clearly diverge and allow continuous tuning of the oscillation frequency within a range of 25%. Despite this, diagram 50 does not explicitly show the changes in mutual inductance, it nevertheless holds true that the basic principle of the occurring frequency changes is based on the change of mutual inductance caused by the combination of electrical and magnetic coupling and the current injection.

Figure 3:
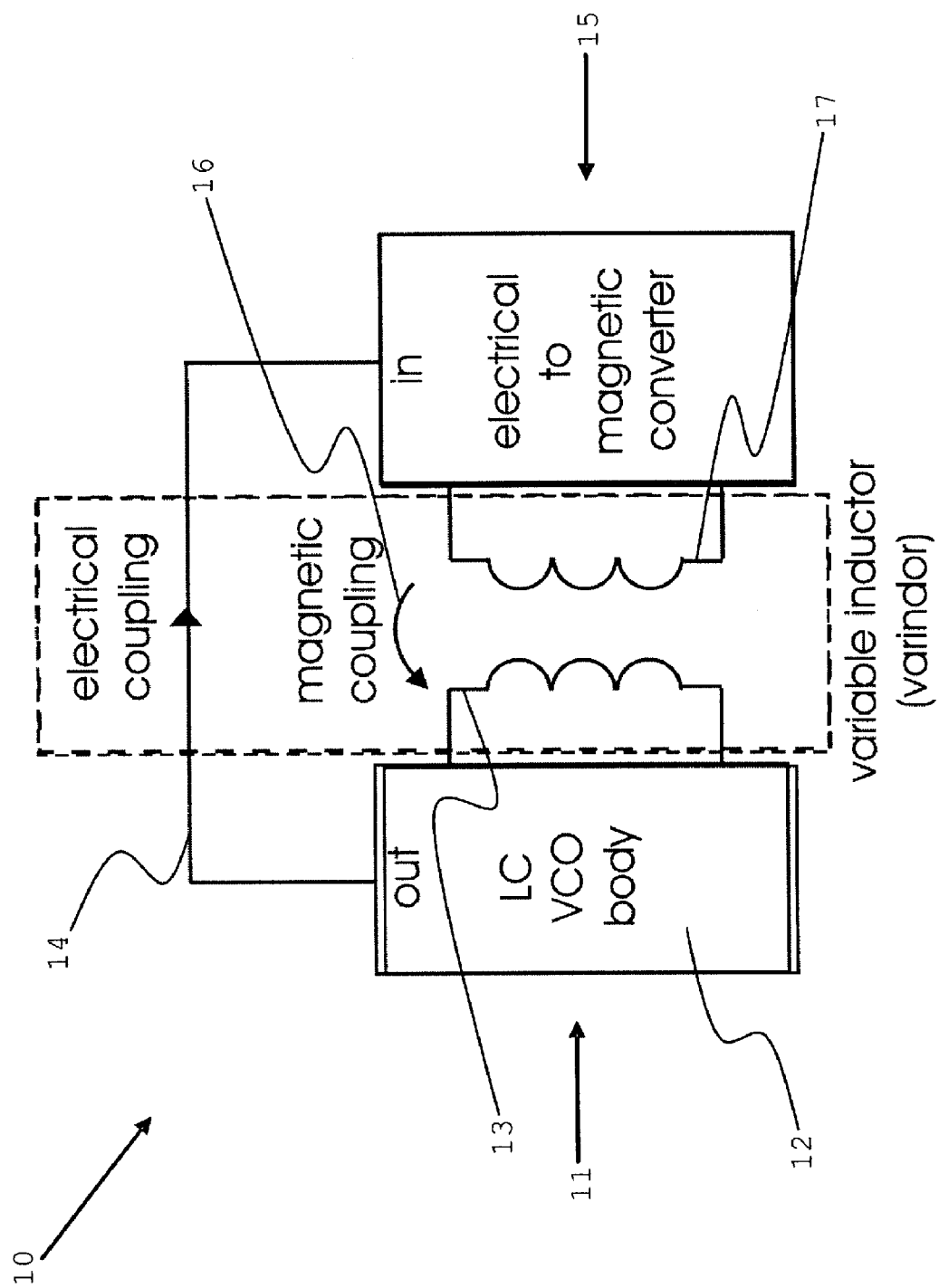
FIG. 3: is a generalized schematic depicting the basic principle of generating a continuously variable inductance based on changes in the mutual inductance owing to the combined electrical and magnetic coupling.

Referring to FIG. 3, a generalized schematic of a variable inductance 10 according to the invention, which can be regarded in general as a varindor 10, is shown. On the left hand side of FIG. 3, a generic LC VCO 11 is shown that is partitioned into a LC VCO body 12 and an inductor coil 13. The LC VCO body 12 basically implements the negative resistance and the capacitance of the resonating LC-tank. The output of the LC VCO body 12, for example, the LC VCO output signal, provides the electrical coupling 14 to the right hand side electrical-to-magnetic converter (EMC) 15. This EMC 15 receives the electrical signal, for example, the LC VCO's 11 output voltage, and converts that signal into a change of the magnetic flux that is further fed back or magnetically coupled 16 to the coil 13 of the LC VCO 11. This magnetic coupling 16 changes the overall inductance of the LC VCO 11 via changes of the mutual inductance and hence a continuous variation of inductance occurs if the EMC 15 is capable of continuously changing the magnetic coupling based on the received electrical signal.

The conversion of the electrical signal to changes of the magnetic flux preferably is performed within the EMC 15 by a voltage-to-current (V/I) converter. In the simplest implementation the V/I-converter is just a transistor where the gate node is connected to the electrical signal, e.g. the output voltage coming from the LC VCO 11, and the drain and source nodes are connected to the coil 17 of the EMC. The gate voltage of that V/I converter modulates the current flowing through the EMC 15 inductor coil 17 and thus a change of the magnetic flux occurs. In further refinement it has to be made sure that the V/I converter can operate correctly by e.g. providing a dc current path via an additional tail current source and a center-tap in the EMC 15 inductor coil 17.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A circuit having a continuously variable inductance, comprising:

an inductive-capacitive (LC) voltage controlled oscillator (VCO) having first and second nodes, a primary coil having first and second ends coupled directly to said first and second nodes, respectively, first and second cross-coupled NMOS transistors having first and second gates coupled directly to said first and second nodes, respectively, and first and second varactors having first and second electrodes coupled directly to said first and second nodes;

a secondary coil magnetically coupled with the primary coil;

first and second transistors in a closed loop with the secondary coil;

a current source having an output amplitude variable in response to change in a control input to vary a magnitude of a mutual inductance between the primary and secondary coils; and first and second switches operable to directly couple gates of the first and second transistors (a) to the first and second nodes of the LC VCO, respectively, or (b) to the second and first nodes of the LC VCO, respectively, to control a sign of the mutual inductance relative to the inductance of the primary coil, such that the control input and the first and second switches are operable to continuously vary a combined inductance of the circuit over a substantial range, the combined inductance including a sum of an inductance of the LC VCO with the mutual inductance.

2. The circuit according to claim 1, wherein the LC VCO is fed by a NMOS current mirror particularly by a NMOS current mirror that is implemented as a tail current source transistor and a diode-connected transistor.

3. The circuit according to claim 2, wherein the secondary coil includes a first coil and a second coil, the first coil coupled to a drain of the first transistor and the second coil coupled to a drain of the second transistor, each of the first and second coils being magnetically coupled with the primary coil.

4. The circuit according to claim 3, wherein the magnetic coupling between the primary coil of the LC VCO and the first and second coils is defined by a coupling factor k according to:

$$k = \frac{M}{\sqrt{L \cdot (L_1 + L_2)}},$$

where M denotes the mutual inductance between the set of the first and second coils and the primary coil.

5. The circuit according to claim 4, wherein the first and second coils are identical and each has a common node connected to a direct current supply voltage.

6. The circuit according to claim 4, wherein the first and second coils are portions of a single inductor coil, wherein the common node is a center-tap of the single inductor coil connected to the direct current supply voltage.

7. The circuit according to claim 6, wherein the first and second transistors coupled in a closed loop with the secondary coil are NMOS transistors.

8. The circuit according to claim 1, wherein the first and second transistors coupled in a closed loop with the secondary coil have a common node connected to said current source.

9. The circuit according to claim 1, wherein the current source includes a tail current source transistor which provides a DC path.

10. The circuit according to claim 1 wherein the first and second transistors have transconductance modifiable in response to back-gate modulation to vary the mutual inductance between the primary and the secondary coils.

11. A circuit as claimed in claim 1, wherein an output frequency of the LC VCO is continuously variable in response to change in the control input.

* * * * *